United States Patent [19]

Patten et al.

[11] Patent Number: 4,468,437

[45] Date of Patent: Aug. 28, 1984

[54] DEPOSITED FILMS WITH IMPROVED MICROSTRUCTURES

[75] Inventors: James W. Patten; Ronald W. Moss; Edwin D. McClanahan, all of Richland, Wash.

[73] Assignee: Battelle Memorial Institute, Richland, Wash.

[21] Appl. No.: 350,738

[22] Filed: Feb. 22, 1982

Related U.S. Application Data

[63] Continuation of Ser. No. 131,922, Mar. 21, 1980, Pat. No. 4,336,118.

[51] Int. Cl.$^3$ .......................... B22F 7/08; C23C 13/00
[52] U.S. Cl. ..................................... 428/553; 428/938; 204/192 R; 204/192 EC; 427/255.5; 427/255.7; 427/270; 427/271
[58] Field of Search ................... 204/192 R, 192 EC; 427/255.5, 255.7, 270, 271; 428/553, 938

[56] References Cited

U.S. PATENT DOCUMENTS

| | | | |
|---|---|---|---|
| 3,021,271 | 2/1962 | Wehner | 204/192 |
| 3,736,242 | 5/1973 | Schwartz et al. | 204/192 |
| 4,006,070 | 2/1977 | King et al. | 204/192 |
| 4,036,723 | 7/1977 | Schwartz et al. | 204/192 EC |
| 4,038,171 | 7/1977 | Moss et al. | 204/298 |
| 4,150,905 | 4/1979 | Kaplan | 401/215 |

OTHER PUBLICATIONS

Patten et al., "Recent Developments in the Application of High Rate Sputtering Technology . . ." Paper 64, 1977 Tokyo Joint Gas Turbine Congress pp. 1–11..
McClanahan et al. "Initial Work on the Application of Protective Coatings . . ." ASME Gas Turbine Division Paper 74–GT–100, Mar. 1974.

Primary Examiner—Benjamin R. Padgett
Assistant Examiner—Matthew A. Thexton
Attorney, Agent, or Firm—Klarquist, Sparkman, Campbell, Leigh & Whinston

[57] ABSTRACT

Methods for improving microstructures of line-of-sight deposited films are described. Columnar growth defects ordinarily produced by geometrical shadowing during deposition of such films are eliminated without resorting to post-deposition thermal or mechanical treatments. The native, as-deposited coating qualities, including homogeneity, fine grain size, and high coating-to-substrate adherence, can thus be retained. The preferred method includes the steps of emitting material from a source toward a substrate to deposit a coating non-uniformly on the substrate surface, removing a portion of the coating uniformly over the surface, again depositing material onto the surface, but from a different direction, and repeating the foregoing steps. The quality of line-of-sight deposited films such as those produced by sputtering, progressively deteriorates as the angle of incidence between the flux and the surface becomes increasingly acute. Depositing non-uniformly, so that the coating becomes progressively thinner as quality deteriorates, followed by uniformly removing some of the coating, such as by resputtering, eliminates the poor quality portions, leaving only high quality portions of the coating. Subsequently sputtering from a different direction applies a high quality coating to other regions of the surface. Such steps can be performed either simultaneously or sequentially to apply coatings of a uniformly high quality, closed microstructure to three-dimensional or large planar surfaces.

17 Claims, 55 Drawing Figures

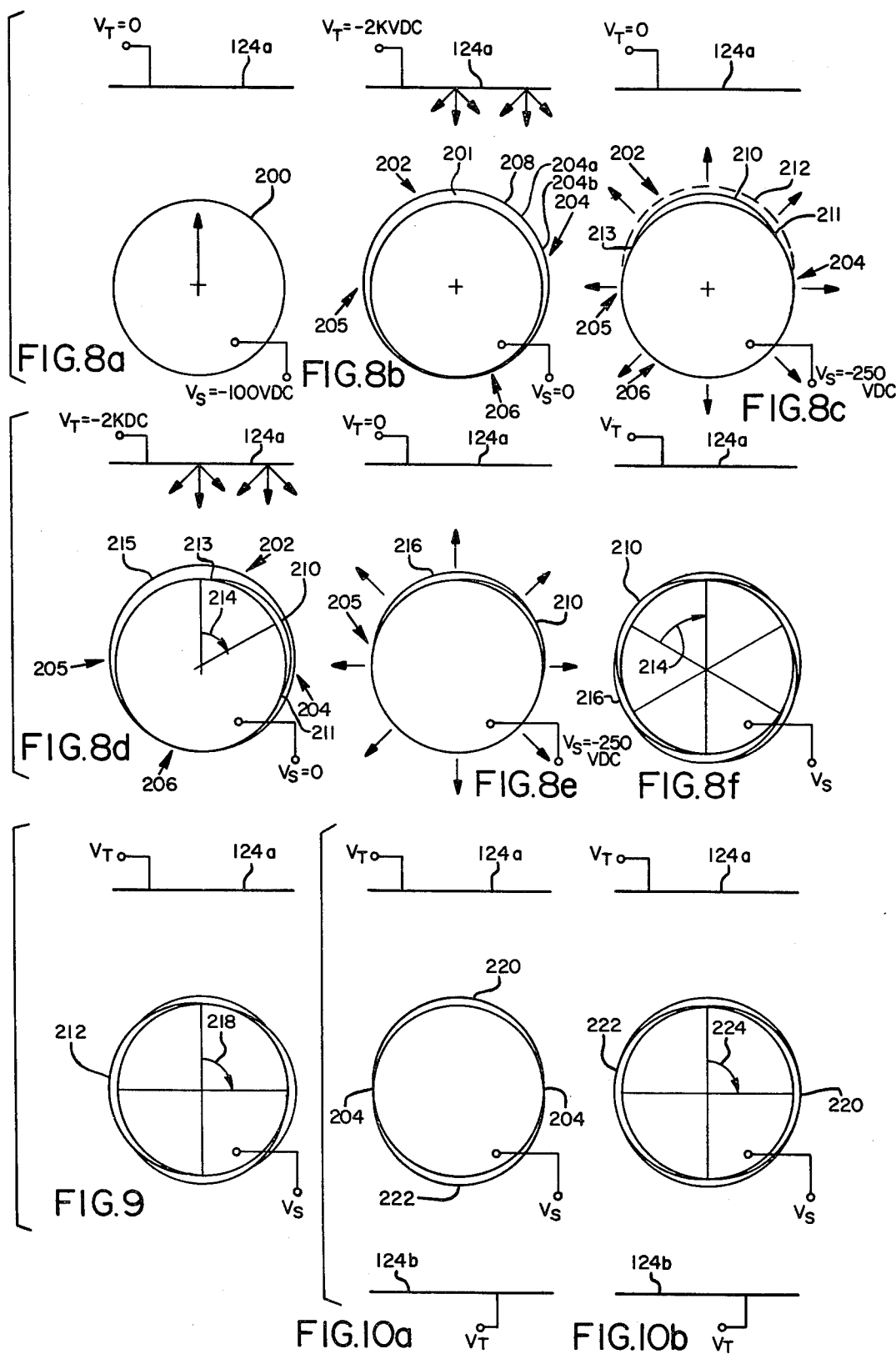

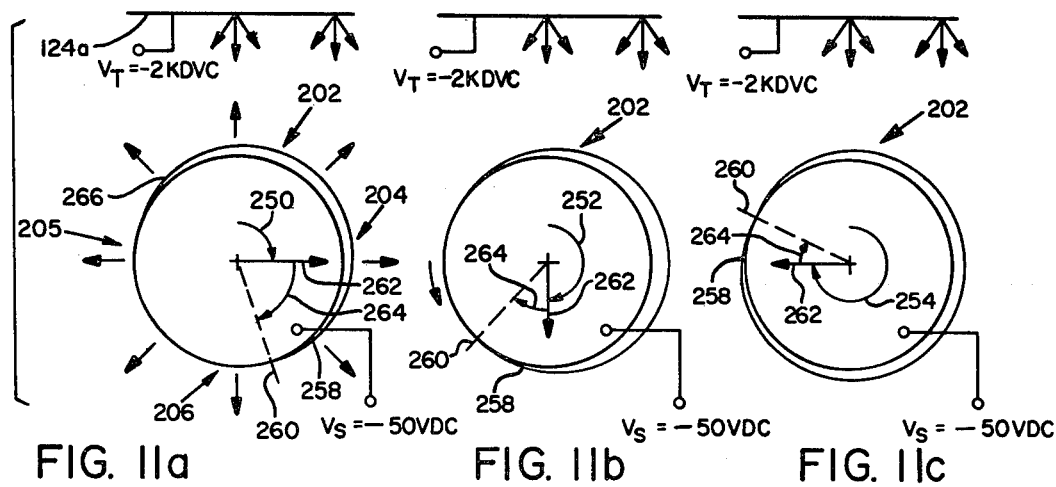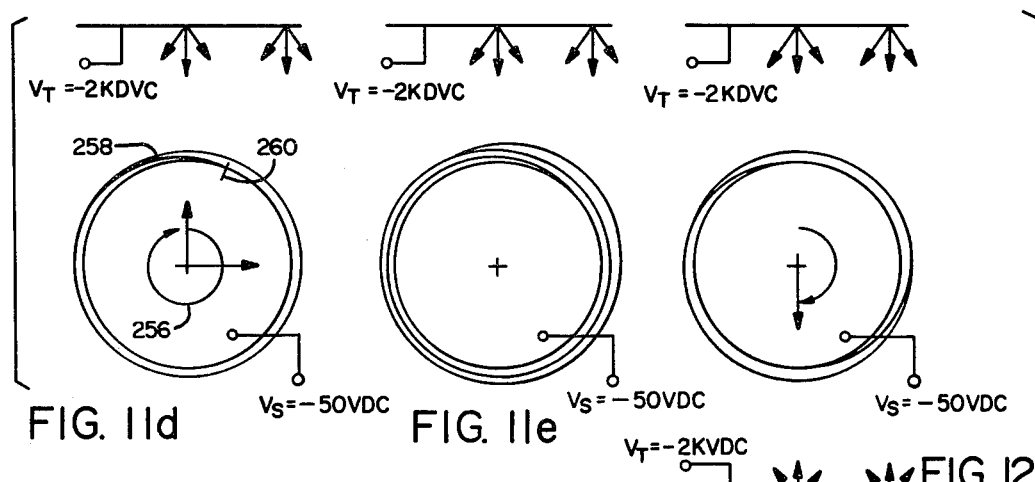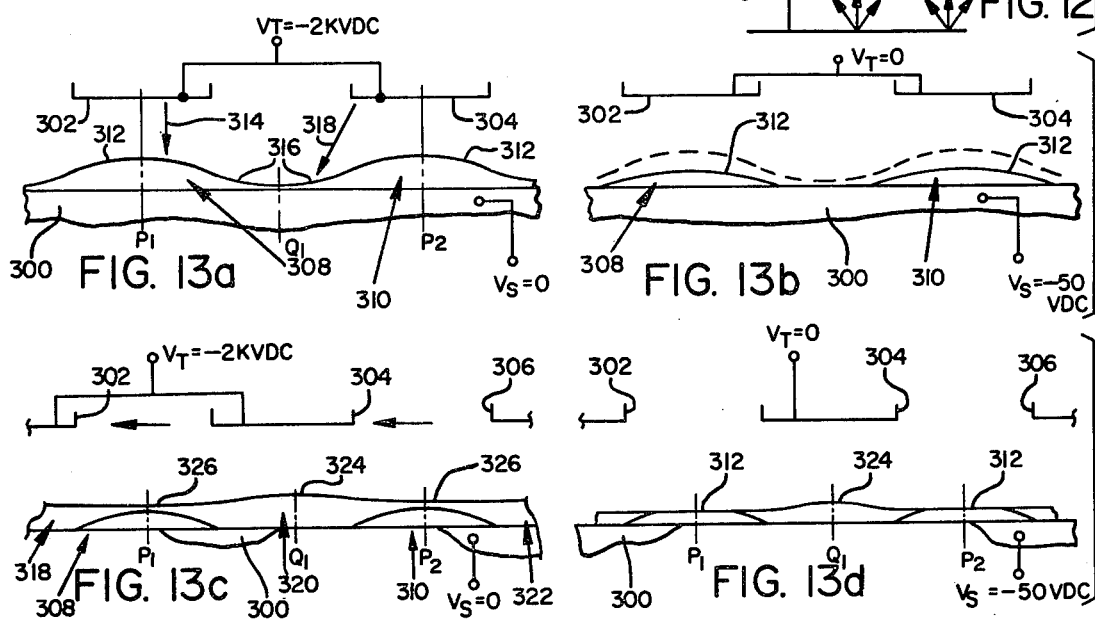

30.5X

500X

500X

500X

500X

2000X 30.5X

500X

500X

500X

500X

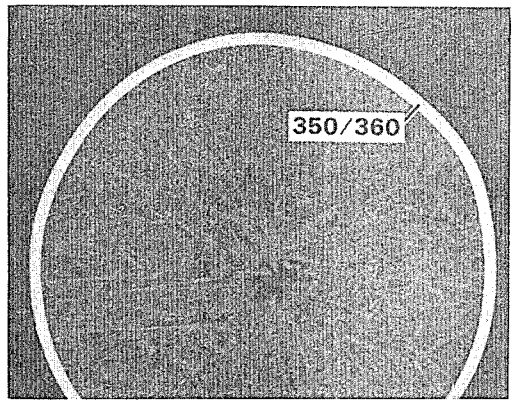
FIGURE 16
32X
HEAT TREATED  NO HEAT TREATMENT
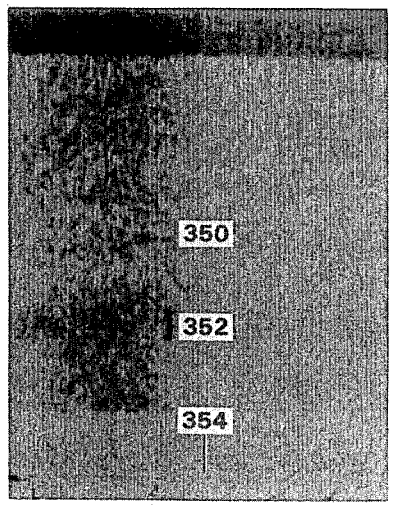 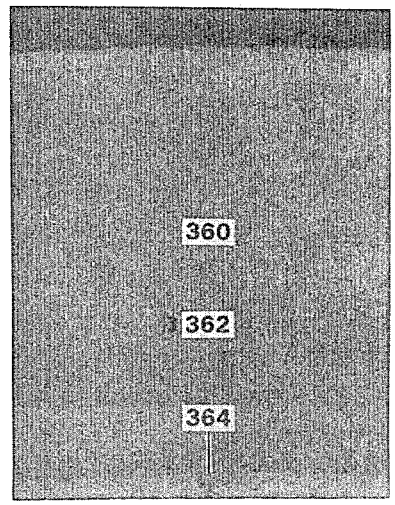
FIGURE 16a (POLISHED)
500X
FIGURE 17a (POLISHED)
500X HEAT TREATED
NO HEAT TREATMENT
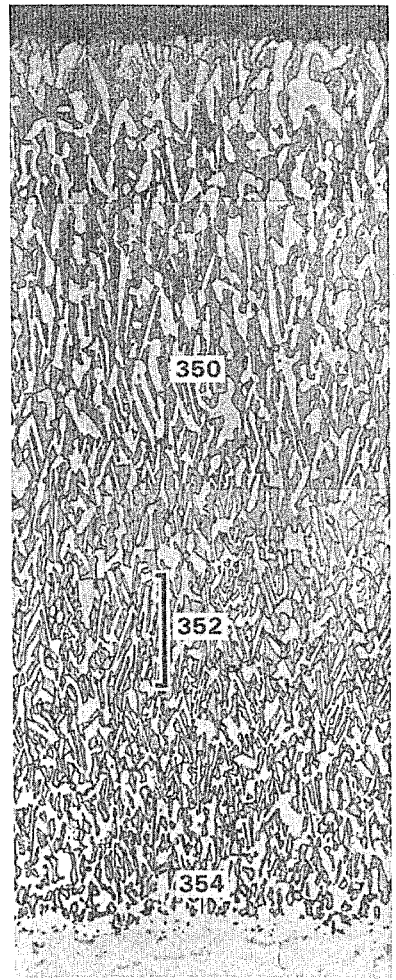
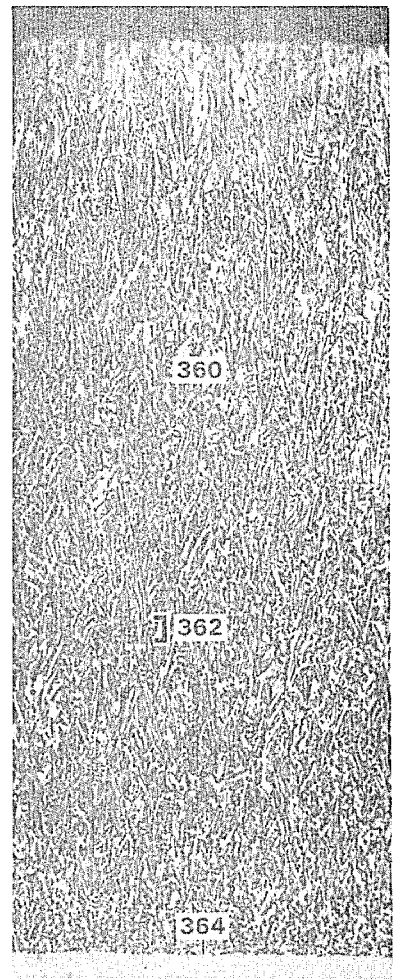
FIGURE 16b (ETCHED)
1050X
FIGURE 17b (ETCHED)
1050X

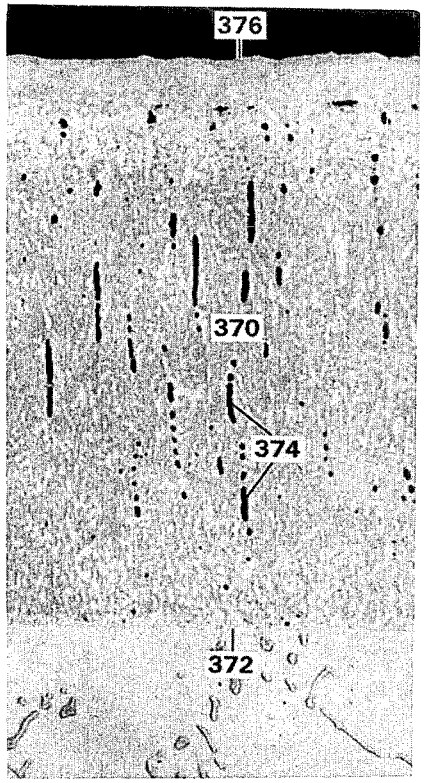 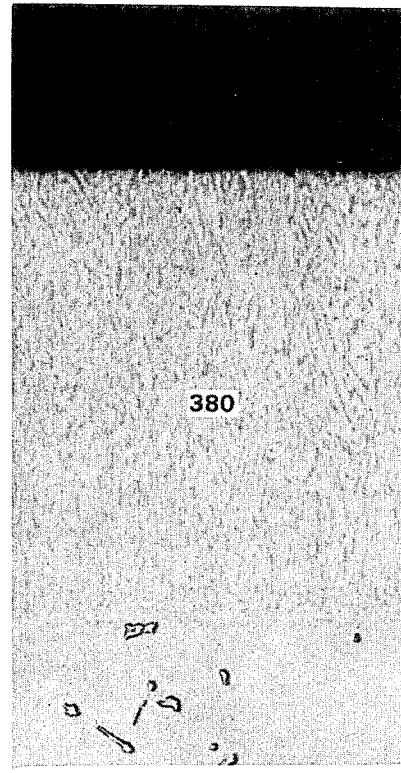
FIGURE 18
850X
FIGURE 19
1000X

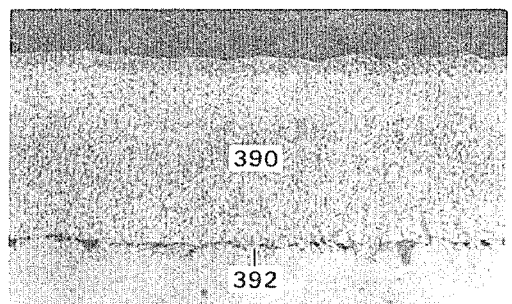
FIGURE 20 (POLISHED)
500X
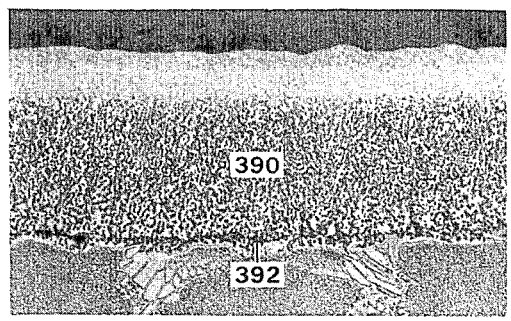
FIGURE 21 (ETCHED)
500X
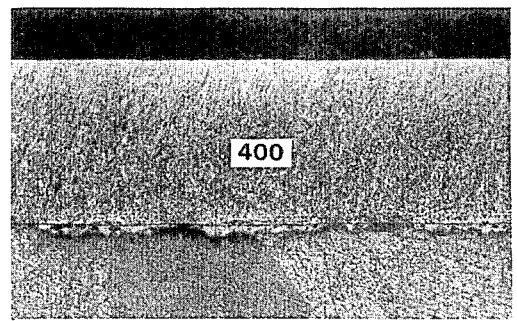
FIGURE 22 (ETCHED)
500X

DEPOSITED FILMS WITH IMPROVED MICROSTRUCTURES

This is a division of application Ser. No. 131,922, filed Mar. 21, 1980, now U.S. Pat. No. 4,336,118.

BACKGROUND OF THE INVENTION

The invention relates generally to reducing microstructural defects in line-of-sight deposited films and more particularly to the elimination of columnar growth defects in physical vapor deposited films by improved deposition methods.

Line-of-sight deposition and coating techniques are quite useful to industry. On a macroscopic scale such techniques provide the capability of uniformly applying a thin film or coating to a surface. Moreover, physical vapor deposition methods, such as sputtering, evaporation and similar line-of-sight deposition techniques, make possible the deposition of solid coatings directly from a vapor state. The resultant coatings have microscopic characteristics that are unobtainable by any other means. Physical vapor deposition methods, and especially sputtering, also enable deposition of films and coatings of a virtually infinite variety of materials. Such coatings can be amorphous or crystalline, metallic or non-metallic, and can be uniformly composed of non-equilibrium combinations of elements in proportions which ordinarily form, in equilibrium, a non-uniform composition or structure when deposited by other techniques.

In general, physical vapor deposition employs some mechanism to eject atoms of coating material from a source or target with sufficient energy to travel along a line-of-sight to the surface of a substrate to be deposited thereon. Physical vapor deposition includes sputtering, evaporative deposition, ion plating, and neutralized ion beam coating. It does not ordinarily include chemical vapor deposition, electroplating, or rapid solidification coating techniques. Ion plating is a variation of both sputtering and evaporative deposition which involves the ionization of atoms in the vapor followed by attraction of some portion of the ionized atoms to the substrate with an electric field. The principal characteristic of these techniques is that they utilize a line-of-sight access of some portion of the material source to the surface to be coated. The concept of line-of-sight access is broadened slightly in ion plating. That method modifies slightly the trajectory of ionized atoms of coating material to enable application of some material to portions of a substrate that are not on a true line-of-sight from the source. However, all of these techniques are essentially line-of-sight deposition methods whose coatings are influenced in generally the same way by line-of-sight defect-producing mechanisms. One such mechanism is geometrical shadowing, which produces columnar growth defects as hereafter described and shown.

Since sputtering is the most important of the presently known physical vapor deposition methods, and is representative of the other methods, the remainder of this discussion will concentrate on sputter deposition. However, the problems and principles discussed hereinafter are to be considered as equally applicable to all physical vapor deposition techniques and to other line-of-sight deposition methods as well.

Sputtered atoms which are emitted generally in the direction of the substrate are deposited as a film or coating on the surface of the substrate. If the substrate and target are aligned parallel planar plates, and the minimum angle of adatom incidence is large, then the entire coating will have a uniformly high quality. However, if the substrate is angled with respect to the target, is large, is wider than the target, or has a three-dimensional surface with portions angled from target, then at least a portion of the coating will be of poor quality. This problem is illustrated in greater detail in FIGS. 2, 5a to 5c, and 14a to 14f.

It has been determined experimentally that the angle of incidence of the net flux on the substrate surface strongly influences the quality of the resultant coating. Geometric shadowing was found to be a principal mechanism by which columnar growth defect structures separated by open boundaries are formed. These structures are generally associated with reduced corrosion resistance and other localized degradation of coating properties. The results of these studies are reported in the article "The Influence of Surface Topography and Angle of Adatom Incidence on Growth Structure in Sputtered Chromium," by J. W. Patten, presented in April, 1979 at the American Vacuum Society's International conference on Metallurgical Coatings, San Diego, Calif., and published in *Thin Solid Films*, Vol. 63, 1979, pages 121–129. Pertinent aspects of these results are discussed hereinafter with reference to FIGS. 5a to 5c and 14a to 14f.

It would be preferable if line-of-sight deposited coatings, and especially physical vapor deposited coatings could be formed without defects due to geometrical shadowing, and particularly without columnar growth structures and open leaders or boundaries between such structures. The open boundaries degrade the mechanical, electronic, and other physical properties of coatings and thus detract from their usefulness in engineering applications. For example, such coatings fail to protect the surface of the substrate from penetration of foreign substances, particularly corrosive fluids. They are also more susceptible to mechanical failure than coatings lacking such defects. The surfaces of such coatings also are often rough. These features are all highly disadvantageous for protective coatings applied to such substrates as marine gas turbine vanes and blades.

Several techniques have been tried to eliminate columnar growth defects from such coatings. One approach involves rotating the substrate as material is being deposited thereon. This technique results in a uniformly mediocre coating which still contains columnar growth defects. Another approach has been to try to manipulate the static geometrics of the target or the substrate or both so as to deposit uniformly at a right angle everywhere on the substrate, as disclosed in FIGS. 5 and 5a and U.S. Pat. No. 4,038,171 to Moss, et al. However, this method also does not satisfactorily eliminate defects due to geometrical shadowing.

Another technique involves heating the substrate after coating to increase the lateral thermal diffusion of material deposited thereon to "heal" the defects and thereby reduce the porosity of the coating. However, heating sufficiently to diffuse the materials laterally, for example, to a temperature of about 80% of the Kelvin melting point for a material such as sputtered copper alloy, allows the deposited materials to segregate into equilibrium crystallites of different phases. The hotter or the longer the heat treatment, the greater this tendency toward equilibrium. Phase segregation reduces both structural and compositional homogeneity of the entire coating, not only in those areas containing columnar growth defects, but in those regions having a high quality closed microstructure. Consequently, one of the principal purposes of physical vapor deposition, namely obtaining a non-equilibrium homogeneous coating structure and composition, is defeated. Another problem with heat treating is that it tends to increase grain size in the coating. The disadvantages of inhomogeneous structure or composition, or large grain size, are readily apparent to persons skilled in the coating art.

Another difficulty arising from heat treatment is the degradation of coating-to-substrate adherence. If the thermal expansion coefficient of the substrate and the coating are quite different, fracturing at their interface can occur. In addition, vertical diffusion of material away from the interface is likely to occur producing voids at the interface or, in some instances, brittle phases. Both of these mechanisms weaken the coating-to-substrate adherence.

A related technique involves coating at an elevated temperature so that sufficient lateral diffusion occurs as the coating is deposited to produce a dense coating. The same disadvantages as those described above apply.

Mechanical treatment of the coating, such as shot-peening, in combination with heat treatment allows somewhat lower temperatures to be used. However, shot-peening can also degrade coating-to-substrate adherence, particularly if the Young's modulus of the substrate differs substantially from that of the coating, by causing fracturing at the interface. In the case of very brittle coatings shot-peening without fracturing the coating is impossible.

Even combining deposition of a first material onto highly cleaned pin surfaces while rotating, followed by deposition of an overlayer of a different material and subsequent heat treatment, fails to eliminate defects due to geometrical shadowing, including columnar growth defects. Referring to FIG. 18, many voids or leaders remain, and some extend vertically through more than half of the thickness of the coating. After a portion of the coating wears away during use, such voids will be exposed.

Accordingly, there remains a need for a physical vapor deposition method which eliminates columnar growth defects without requiring mechanical or thermal treatments. For many purposes, it would, at least, be desirable to obtain a coating in which voids or leaders do not extend completely through the coating; that is, are limited to a fraction of the thickness of the coating. It would be even better if such voids or leaders were limited to about the height of the asperities which cause them. However, it would be most preferable to have a deposition method which would provide extremely high quality coatings which are essentially unaffected by geometrical shadowing.

A variety of sputtering methods have been proposed whose objectives are to obtain specific coating characteristics. For example, in U.S. Pat. No. 3,021,271, to G. Wehner it was proposed to use ion bombardment of the substrate to effect controlled resputtering of deposited material to maintain the overall rate of deposition below a predetermined critical value. The purpose was to grow monocrystalline coatings rather than the polycrystalline coatings having small crystallites which are formed by high rates of deposition. In U.S. Pat. No. 3,736,242, to N. Schwartz et al., resputtering was a means of controlling the crystalline phase structure and, thus, the resistivity and temperature coefficients of deposited films. In U.S. Pat. No. 4,036,723, to B. Schwartz et al., resputtering at different rates during deposition to avoid initial preferential etching of crystal grain boundaries in polycrystalline substrates and to thereby form a smooth insulative layer on a substrate. U.S. Pat. No. 4,038,171, to Moss et al., discloses a high deposition rate sputtering apparatus in which the substrate can be negatively biased during operation. Resputtering can thus be obtained in such apparatus if desired.

In each of the foregoing patents, the surfaces of the substrate and the source of sputtered material were parallel, planar and of approximately the same lateral dimensions. In such patents, substantially all of the material is deposited nearly perpendicularly to the substrate surface. Hence, the problem of geometric shadowing was not addressed in these patents.

U.S. Pat. No. 4,006,070 to King et al. discloses apparatus for sputtering metal oxide films on substrate surfaces of large lateral dimensions, such as a windscreen for a vehicle. The apparatus includes multiple, laterally spaced-apart sources of material which are reciprocated laterally along the substrate during deposition. The amplitude of reciprocation is sufficient to cause material to be deposited substantially uniformly over the entirety of the surface. However, it does not appear that King et al. addressed the problem of geometrical shadowing. Although the windscreens are curved, the sources are positioned along a parallel curve so that shadowing in the curved portions of the surface may be reduced. However, it appears that some geometrical shadowing is likely to occur on portions of the substrate below the spaces between the sources. Nevertheless, King et al. make no attempt to minimize the effect of geometrical shadowing on the resultant film. Defective regions of the coating are simply covered up as a result of reciprocation of the source assembly during deposition.

In our own prior work, described in ASME Gas Turbine Division Paper 74-GT-100, "Initial Work on the Application of Protective Coatings to Marine Gas Turbine Components by High Rate Sputtering", authored by E. D. McClanahan et al., Mar. 30—Apr. 4, 1974, and in 1977 Tokyo Joint Gas Turbine Congress Paper No. 64, "Recent Developments in the Application of High-Rate Sputtering Technology to the Formation of Hot Corrosion Resistant Metallic Coatings", authored by J. W. Patten et al., May 22–27, 1977, we experimented with several approaches to solving the problems of obtaining high quality coatings. The former paper discloses coatings on small planar surfaces, both in an as-sputtered condition and after heat treating. In some of the experiments, biasing of the substrate to −30 and −50 volts DC was tried and was found to have some effect on the coarseness of columnar grain structure. However, changes in deposition temperature had similar effects and the relative contributions of each parameter were not determined. The latter paper discloses both high- and low-integrity sputtered coatings on three-dimensional turbine components, both before and after heat treating, and includes coatings obtained by rotation of the substrate. However, no reference is made to biasing of the substrate. Nor does this paper teach the advantages of eliminating columnar growth defects due to geometrical shadowing by manipulating the method of deposition rather than resorting to post-deposition heat treatments. Finally, neither paper discloses the mechanism by which columnar growth defects are formed or a method for inhibiting their formation or propagation.

SUMMARY OF THE INVENTION

Accordingly, it is an object of the invention to improve the microstructure of line-of-sight deposited films, particularly those formed on three dimensional surfaces.

Another object of the invention is to provide a line-of-sight method of deposition for reducing coating defects due to geometrical shadowing.

An additional object of the invention is to form physical vapor deposited coatings without microstructural defects due to geometric shadowing.

Another object of the invention is to eliminate columnar growth defects in physical vapor deposited coatings without heat treating subsequent to deposition of the coatings.

A further object is to provide a method of physical vapor deposition capable of producing coatings having a closed, non-porous microstructure uniformly over large planar substrate surfaces or three-dimensional surfaces.

A further object is to eliminate defects in coatings deposited at relatively low temperatures, for example, at less than 0.6 times the absolute melting temperature $T_m$ of the coating material.

Yet another object of the invention is to form sputter-deposited coatings on three-dimensional and other substrate surfaces having an as-deposited microstructure free of columnar growth defects substantially uniformly over such surfaces.

Still further objects of the invention are to form sputter-deposited coatings having:

1. A closed microstructure characterized by a non-equilibrium composition;
2. A substantially homogeneous microstructure;
3. A substantially homogeneous composition;
4. A very fine grain size; and
5. An as-deposited coating-to-substrate adherence.

The invention takes advantage of the fact that the same line-of-sight mechanism that produces a high quality deposit in a first region of a substrate surface and a defective deposit in a second such region can be used to keep the defective deposit relatively thinner than the deposits of higher quality. Both the desirable deposition characteristics of sputtered and other physical vapor deposited coatings and the undesirable columnar growth defects in such coatings are eliminated when the coated substrate is subjected to post-deposition heat or mechanical treatments, or when deposition is carried out at sufficiently high temperatures to effectively cause heat treatment to occur during deposition. The invention enables reduction or elimination of columnar growth defects without such treatments so that the desirable deposition characteristics can be retained. Heat treatment may still be used following deposition, or deposition may be carried out at a high temperature, if desired for other reasons, such as relieving substrate stresses, but these techniques are not necessary to reduce defects due to geometrical shadowing.

The invention is of a line-of-sight deposition method comprising the steps of depositing an amount of coating material non-uniformly over a substrate surface, such that a greater fraction of material is deposited on a first region at a nearly perpendicular angle of incidence and a lesser fraction is deposited on a second region at an acute angle, removing a lesser amount of deposited material uniformly over such surface, and repeating the foregoing steps in a region adjacent to or overlapping the first region. Material deposited at a nearly perpendicular angle in a first region of the surface accumulates more quickly than material deposited at lesser, or more acute, angles in a second region of the surface. Material deposited at a nearly perpendicular angle in the first region is relatively unaffected by geometrical shadowing while material deposited at increasingly acute angles is increasingly affected by geometric shadowing. By removing material uniformly from the surface, much of the material deposited in the second region is removed while a greater portion of the more desirable material in the first region remains. The more desirable material preferably has a closed, nonporous microstructure substantially free of columnar growth defects. After the removal step, the orientation between the substrate and source can be changed and the nonuniform deposition and uniform removal steps repeated, so that the more desirable material is applied to a different region of the surface, still retaining the more desirable material in the first region. After sufficient repetition of the steps of depositing from progressively changing orientations and removing uniformly, the entire surface is coated with material. Any coating defects due to geometrical shadowing can be held within specific limits to meet the needs of specific applications of the coating substrate. Columnar growth defects can be completely eliminated to obtain coatings of the highest quality. Moreover, the resultant coating can have all of the native qualities of the material as originally deposited. These qualities need not be sacrificed by subjecting the substrate to a post-deposition heat or mechanical treatment in order to heal defects due to geometrical shadowing. The invention includes a method for sequentially depositing, removing and changing the substrate to source orientation. The invention also includes a method for simultaneously depositing, removing and changing the substrate to source orientation.

The foregoing and other objects, features and advantages of the invention will become apparent from the following detailed description of preferred embodiments of the invention, which proceeds with reference to the drawings.

BRIEF DESCRIPTION OF THE DRAWINGS

FIGS. 8a–8f are diagrams of a target and a cylindrical substrate illustrating the steps of a first embodiment of the invention in which the steps of the method are performed sequentially.

FIG. 9 shows a coated substrate corresponding to that of FIG. 8f when somewhat less material is removed in the step of FIG. 8c to produce a high integrity coating to somewhat less exacting requirements.

FIGS. 10a and 10b show two steps in the method illustrated in FIGS. 8a–8f when two targets are used to deposit onto the substrate.

FIGS. 11a–11e are diagrams similar to FIGS. 8a–8f illustrating the steps of a second embodiment of the invention in which the steps of the method are performed simultaneously.

FIG. 12 is a diagram of a substrate similar to that of FIG. 11a illustrating the use of two targets to deposit material simultaneously onto the substrate.

FIGS. 13a–13d illustrate steps of the first embodiment of the invention as used to coat a substrate of large lateral dimensions.

FIG. 16 is an optical photomicrograph taken at 32× of a cross-section of a cylindrical pin after coating in accordance with the invention.

FIGS. 16a and 16b are optical photomicrographs taken at 500× and 1050×, respectively, of a pin like that of FIG. 16 following heat treatment; FIG. 16b being etched to enhance the microstructure.

FIGS. 17a and 17b are optical photomicrographs of a cross-section of a cylindrical pin like that of FIG. 16 after coating in accordance with the invention but without subsequent heat treatments, the views corresponding to the views of FIGS. 16a and 16b.

FIG. 18 is an optical photomicrograph taken at 850× of a cross-section of a cylindrical pin following deposition while simultaneously rotating the pin and subsequent heat treatment to heal columnar growth defects.

FIG. 19 is an optical photomicrograph taken at 1000× of the coating of FIG. 16.

FIGS. 20 and 21 are optical photomicrographs taken at 500× of a cross-section of a portion of a turbine blade coated in accordance with the invention without any prior surface preparation; FIG. 20 being shown as-polished, FIG. 21 being etched to enhance the microstructure and blade surface irregularities.

FIG. 22 is an optical photomicrograph taken at 500× of a cross-section of a pin coated in accordance with the invention so as to obtain an even finer grain structure than that of FIG. 17a.

DETAILED DESCRIPTION OF PREFERRED EMBODIMENTS

Apparatus

In general, any line-of-sight deposition apparatus can be used, or modified to be used, to perform the present invention. One element that is required is a source defining deposition means for emitting material along a line-of-sight to be deposited non-uniformly on a substrate surface. Virtually any physical vapor deposition apparatus can provide deposition means meeting these requirements. A second element needed for performing the invention is a removal means for removing deposited material approximately uniformly over the substrate surface. Resputtering apparatus is an example of suitable uniform removal means. The last element needed is a position changing means for changing the orientation of the substrate with respect to the source so that material can be deposited on the substrate surface from varying angles. Position changing means can take several different forms, depending upon the geometry of substrate surface to be coated. For three-dimensional substrates which are smaller than the source, position changing means can include means for rotating the substrate, means for moving the source angularly around a fixed substrate, or means for depositing alternately from multiple sources angularly positioned around the substrate. For substrate surfaces of relatively large lateral dimensions, such as planar surfaces, position changing means can be means for moving either the substrate or the sources laterally with respect to one another, or means for depositing alternately from multiple sources laterally positioned along the substrate.

Figure 1:
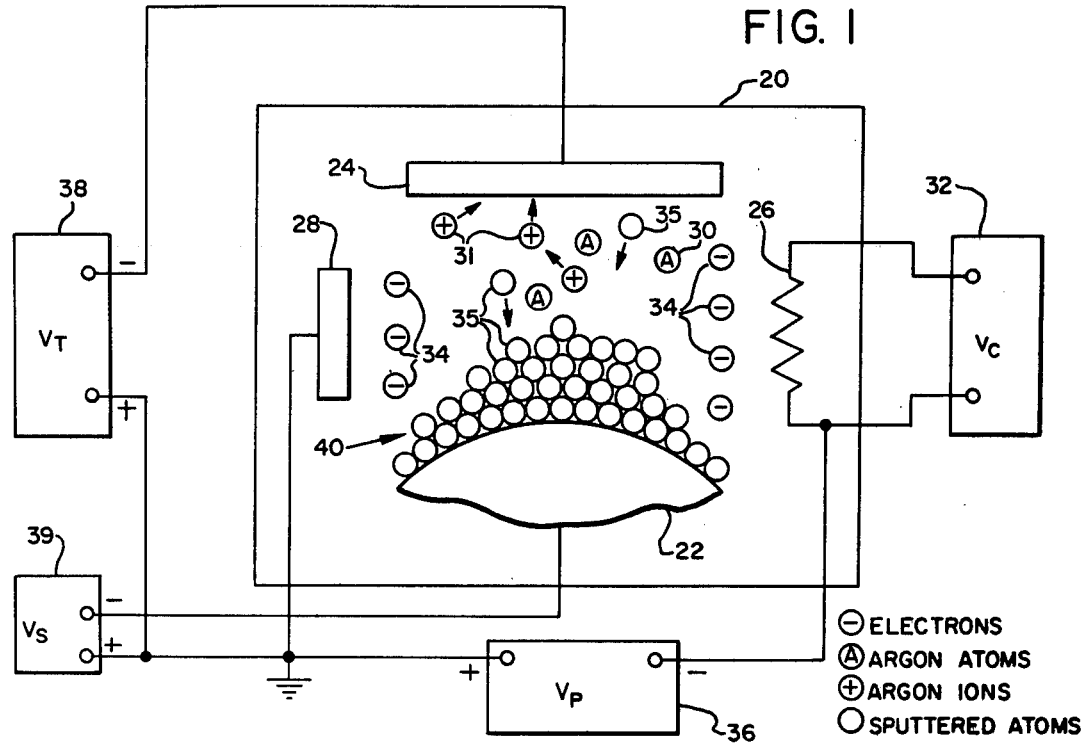
FIG. 1 is a diagram of a triode sputtering apparatus which can be used for performing the present invention, including an enlarged portion of a cylindrical substrate as viewed in cross-section.

FIG. 1 is a diagram of a triode sputtering system. The system includes a vacuum chamber 20, a substrate 22 mounted on a substrate holder (not shown), a source or target 24, a thermionic emissions cathode 26, an anode 28 and atoms 30 of an inert gas, such as argon. Position changing means (not shown) can be connected to either the substrate 22 or to the source 24, as described hereinafter. The cathode is heated by a power supply 32, causing it to emit electrons 34. The cathode is negatively biased with respect to the anode by a plasma power supply 36 to accelerate the electrons away from the cathode, establishing a current through the inert gas. The electrons ionize the inert gas atoms 30 to form positive ions 31. The target is negatively biased by a target power supply 38 to attract the argon ions to the target. The ions strike the target surface with sufficient energy to eject or "sputter" target atoms 35 from the surface of the target at high velocity. It is believed that the sputtered target atoms leave the surface of a flat target with approximately a cosine spatial distribution. Many of the sputtered atoms are deposited on the substrate. The remainder are deposited on the inner surfaces of the vacuum chamber. Atoms deposited on the substrate can be partially removed by resputtering. Resputtering is accomplished by operating the substrate voltage supply 39 to negatively bias the substrate to cause positive ions of inert gas to bombard the substrate.

U.S. Pat. No. 4,006,070 to King et al discloses an example of apparatus which can be used for depositing films or coatings on approximately planar surfaces of large lateral extent. Such apparatus can be modified for use in performing the present invention by adding removal means. Such removal means would be added to the apparatus disclosed by King et al by providing a biasing power supply 39 electrically to the substrates in the manner shown in FIG. 1 for negatively biasing the substrate to resputter atoms therefrom.

Figure 3:
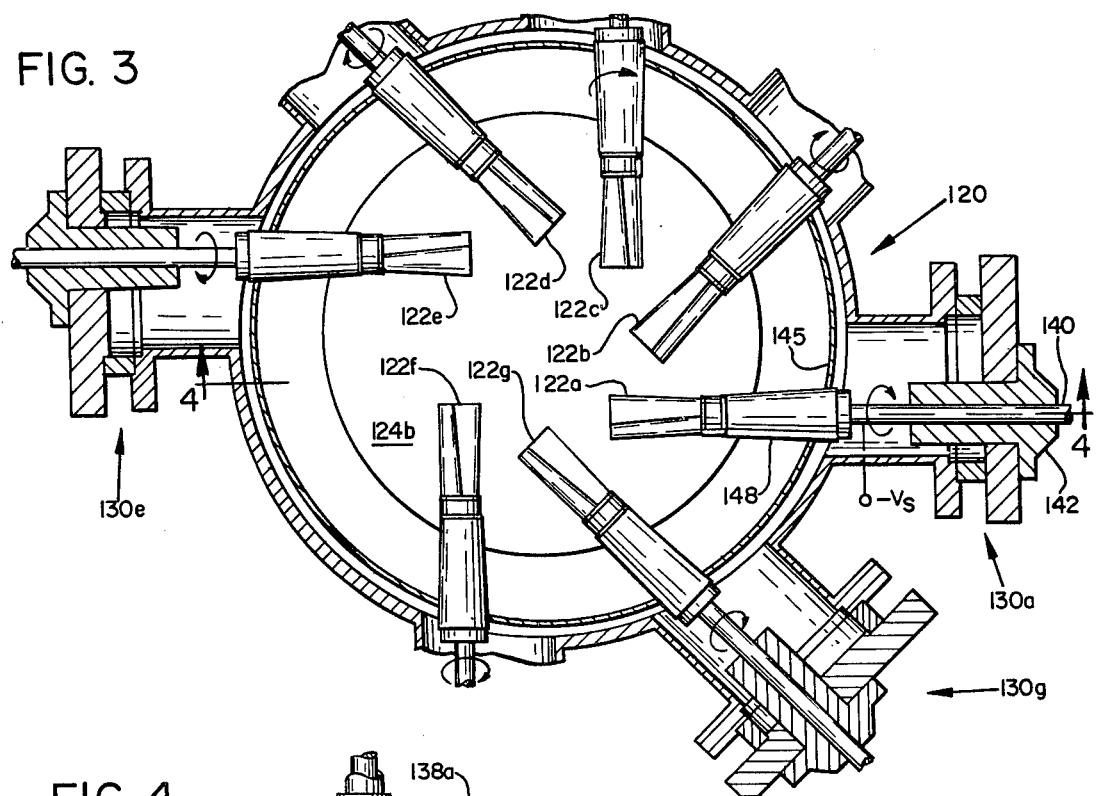
FIG. 3 is a horizontal cross-sectional view of a triode sputtering apparatus usable for performing the present invention, multiple turbine blades being mounted as substrates therein.
Figure 4:
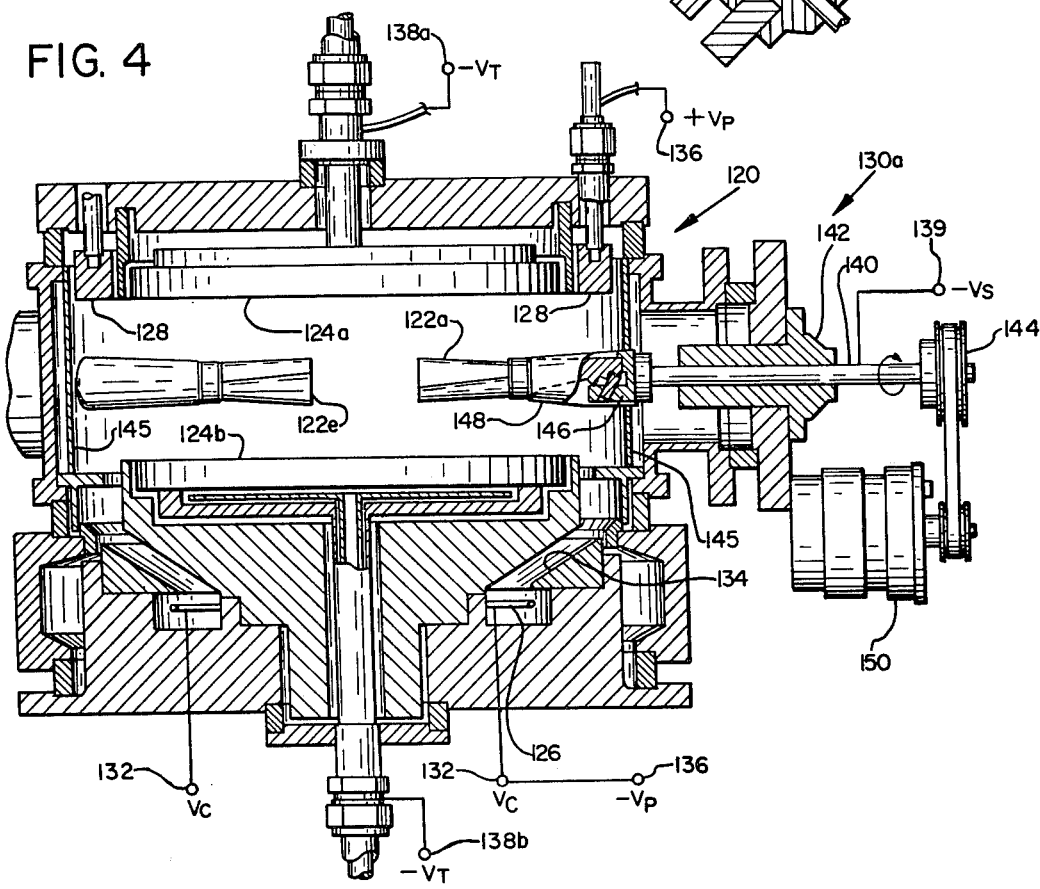
FIG. 4 is a vertical cross-sectional view of the apparatus of FIG. 3.

FIGS. 3 and 4 show an example of a suitable apparatus for coating three dimensional substrates in accordance with the invention. Another suitable apparatus is disclosed in U.S. Pat. No. 4,038,171 to Moss et al. The apparatus of FIGS. 3 and 4 includes a generally cylindrical vacuum chamber 120 containing multiple substrates, such as marine gas turbine blades 122a–g, which are mounted in angularly spaced apart positions. Two targets 124a and 124b, in the form of large circular discs, are positioned above and below the substrates. An annular heated filament type cathode 126 serves as a source of electrons. An annular anode 128 surrounds upper target 124a. A series of substrate stations 130a–g are radially positioned around the vacuum chamber.

The substrate stations, of which station 130a is typical, each include a cylindrical shaft 140 extending from a pulley sheave 144 outside the chamber through a rotary seal 142 and a disposable shield 145 to a substrate holding fixture 146 inside such chamber. A disposable shield 148 surrounds the holding fixture and a portion of the turbine blade to prevent deposition of material thereon. Sheave 144 is connected by a pulley to a servomotor 150, whose operation provides means for rotating the substrate.

The apparatus of FIGS. 3 and 4 is connected to a series of power supplies substantially as illustrated in FIG. 1. A cathode power supply 132 is connected across the cathode for generating electrons which can flow into vacuum chamber 120 through an annular passageway 134 surrounding the lower target 124b. A plasma power supply 136 is connected between the cathode and the anode so that electrons generated by the cathode are accelerated away from the cathode. A biasing power supply 139 has its negative voltage lead connected to each of the substrates through their respective substrate stations for negatively biasing the substrates. Two target power supplies 138a, 138b are used. One power supply is connected to each of the targets for independently biasing such targets.

The cathode power supply has a voltage range of 0 to 10 volts AC. The plasma power supply is a 0 to 75 volt DC supply, and is operated to bias the cathode to a potential with respect to the anode of about $-50$ volts DC. The target power supply provides a voltage range of 0 to $-3$ kilovolts DC and is typically operated between $-2.0$ and $-2.4$ kilovolts during deposition. The biasing power supply has a range of 0 to 500 volts DC. It is typically operated during the removal step so as to negatively bias each substrate to $-35$ to $-300$ volts DC.

Further capabilities of the apparatus used herein, such as cooling, radio frequency (RF) and combined mode sputtering, and plasma shaping, will be readily apparent from a review of U.S. Pat. No. 4,038,171 and, hence, will not be discussed further herein. Operation of the apparatus described above to perform the process of the present invention is described hereinafter.

The chemical compositions of the target and substrate are essentially matters of choice, limited only by the inherent compatibility of the materials being used with sputtering, with one another, and with the intended use of the resultant coated substrate, as is widely known in the art. Examples of materials deposited by high rate sputtering are listed in Table 1 of "State-of-the-Art for High-Rate Sputter Deposition", published in Proceedings of the Workshop on Alternatives for Cadmium Electroplating in Metal Finishing, EPA 560/2/79-003, at pp. 423–464, March, 1979, available through the National Technical Information Service, U.S. Department of Commerce.

General Description of Method

Preparatory to depositing on a substrate, the substrate and sputtering apparatus are cleaned. Each type of substrate has its own cleaning procedure. Before the substrate is placed in the deposition apparatus, the internal surfaces of the apparatus are vapor degreased and ultrasonically cleaned. After assembly, the vacuum chamber is evacuated. Krypton or another sputtering gas is then added to raise the pressure to about 0.003 Torr., (0.4 Pa.) and a thermionic discharge is ignited between the cathode and anode to establish a plasma. The substrate surface is then cleaned by etching the substrate with ions. Etching is accomplished in the sputtering apparatus of FIGS. 3 and 4 by negatively biasing the substrate to, typically, $-100$ volts DC for 5 to 10 minutes at a current density of about 5 ma./cm. This causes the positive ions in the plasma to bombard the substrate and remove a small quantity of material therefrom. To cause sputtering from the target to the substrate, the target power is increased over 15 to 60 minutes to a range of $-2000$ to $-2400$ volts and 5 to 20 ma./cm., depending on the substrate and coating materials used and the desired rate of deposition.

In the first step of the process of the present invention, material is deposited non-uniformly on the substrate. Such material is emitted from the target or source along a line-of-sight toward the substrate surface. Upon striking the substrate surface, such material bonds with the material of the substrate. The quality of the coating varies from one region to another because of geometrical shadowing. At the same time, nonuniform deposition maximizes the accumulation of high quality deposits while minimizing the accumulation of poorer quality deposits. The mechanisms that make this possible are described in the following paragraphs.

Figure 2:
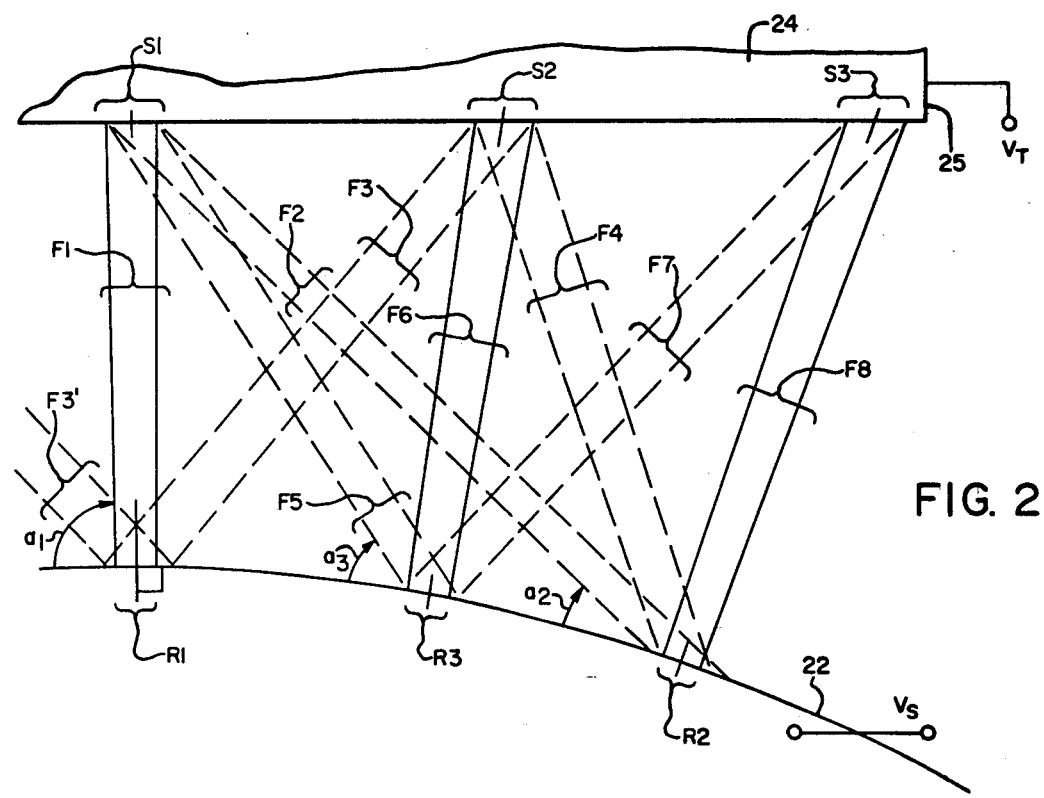
FIG. 2 is an enlarged diagram of portions of the target and substrate of FIG. 1.

FIG. 2 shows a portion of a substrate surface 22, with coating 40 omitted, and a portion of target 24. For convenience, small segments of the substrate have been labeled $R_1$, $R_2$ and $R_3$, and small increments of the target have been labeled $S_1$, $S_2$ and $S_3$.

Target increments $S_1$, $S_2$ and $S_3$ each act essentially as point sources emitting sputtered atoms in a radiating flux. The flux radiating from first increment $S_1$ includes a first portion $F_1$ emitted substantially perpendicularly from the target surface and a second portion $F_2$ which is emitted at an acute angle from such surface. Flux portion $F_1$ is deposited on a first region $R_1$ of the substrate at a substantially perpendicular angle of incidence $a_1$. Flux portion $F_2$ is deposited over an area encompassing a second region $R_2$ of the substrate at an acute or grazing angle of incidence $a_2$.

At the same time, a second target increment $S_2$ emits a flux including third and fourth flux portions $F_3$ and $F_4$ at acute angles to the target surface. Flux portion $F_3$ is deposited in a region encompassing substrate region $R_1$ at an acute angle to the substrate tangent in such region, adding vectorially to the contribution in such region of flux portion $F_1$. Similarly, flux and portion $F_4$ is deposited over an area encompassing substrate region $R_2$, also at an acute angle, to add vectorially to flux portion $F_2$.

Without further description, it is apparent that region $R_3$, between regions $R_1$ and $R_2$, also receives material from target increments $S_1$ (flux portion $F_5$) and $S_2$ (flux portion $F_6$) at angles of incidence (for example, angle a for flux $F_5$) that are related to the distance from and orientation relative to the respective target increments. Similarly, another target increment $S_3$ emits material, including flux portions $F_7$ and $F_8$, which is deposited at different angles on substrate regions $R_1$, $R_2$ and $R_3$.

Consequently, for substrate regions, such as region $R_1$, positioned inwardly of the target perimeter and parallel to the target—the target and substrate being smaller than their spacing—the material arriving approximately perpendicularly to the surface greatly predominates over the material arriving at more acute angles. For substrate regions not parallel to the target, such as regions $R_2$ and $R_3$, or for regions extending beyond the target perimeter, as in the case of large planar surfaces, or for very large targets, the material arriving at more acute angles becomes significant. As a result, some regions, (such as regions $R_2$ and $R_3$) receive poorer quality coatings than other regions (such as region $R_1$).

Figure 5A:
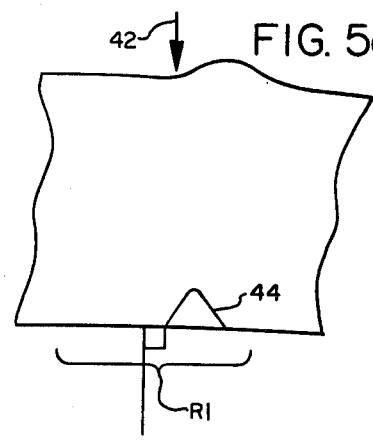
FIGS. 5a, 5b and 5c are further enlarged views of portions of the substrate of FIG. 2 as they would appear following the non-uniform coating step of the present invention.
Figure 5B:
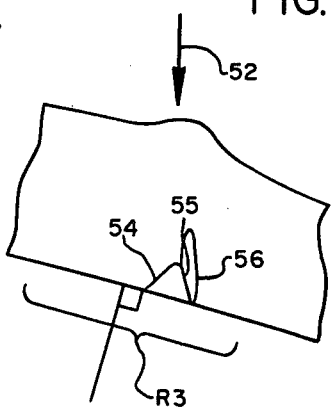
Figure 5C:
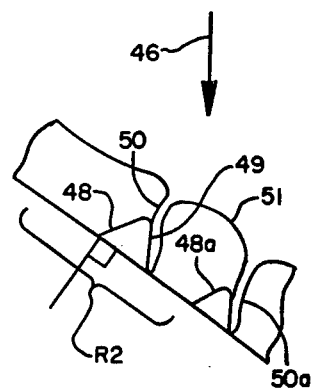

Regions $R_1$, $R_2$ and $R_3$ are illustrated on an enlarged scale in FIGS. 5a, 5b and 5c. In FIG. 5a, region $R_1$ is substantially perpendicular to the net flux, indicated by arrow 42. Consequently, as asperity 44, which can be a foreign particle or an imperfection in the surface of the substrate, creates little if any "shadow" to the incident flux. Sputtered atoms are deposited substantially uniformly all around asperity 44. In FIG. 5c, the net flux, indicated by arrow 46, is incident to the surface tangent of region $R_2$ at a lesser or acute angle. Accordingly, an asperity 48 positioned in region $R_2$ forms a shadow to flux 46 on its leeward side 49. As sputtered atoms accumulate to form a coating on region $R_2$, a void or leader 50 forms in the shadow of the asperity. When the angle of incidence of the net flux is sufficiently small or acute, such voids continue to propagate even after the thickness of the coating exceeds the height of the asperity. An adjacent asperity 48a forms a second leader 50a. Such leaders form the boundaries of a growth column 51. In FIG. 5b, the net flux, indicated by arrow 52, is incident with the surface tangent of region $R_3$ at a non-perpendicular angle that is greater (less acute) than the angle of incidence observed in FIG. 5c. Consequently, an asperity 54 in region $R_3$ forms a smaller shadow on its leeward side 55 than is formed by asperity 48. Although a void 56 will form in such shadow, it will be smaller than void 50 and as a result of surface mobility in the deposit, the void can be pinched off by the accumulation of material in region $R_3$ so that it will not propagate all the way to the surface of the coating.

Figure 14A:
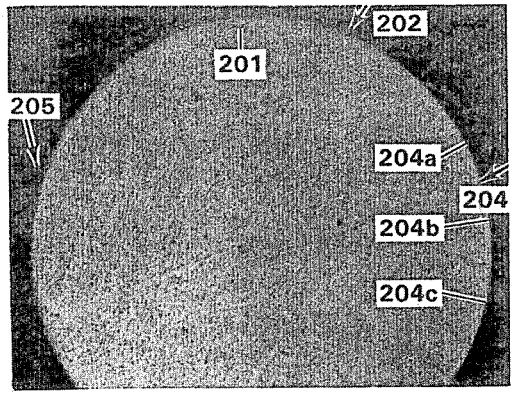
FIG. 14a is an optical photomicrograph taken at 30.5× showing a cross-section of a cylindrical pin following the non-uniform deposition step of the method of the present invention, as shown in FIG. 8b.
Figure 14B:
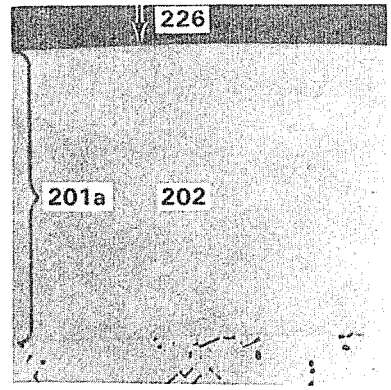
FIGS. 14b–14e are optical photomicrographs taken at 500× showing regions of the pin and coating of FIG. 14a at 0°, 60°, 80° and 100° proceeding clockwise around the surface of the pin.
Figure 14C:
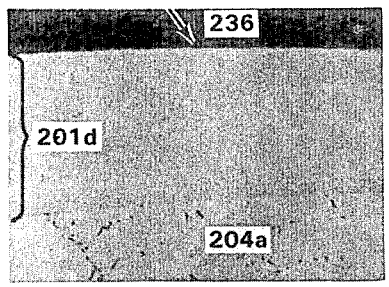
Figure 14D:
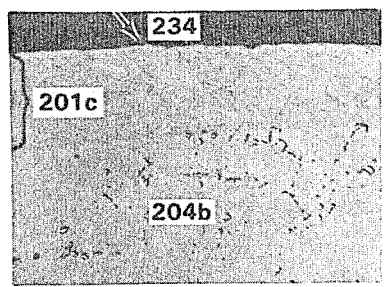

FIGS. 14a through 14f illustrate the microstructure of portions of a cylindrical pin which has been sputter-coated in the manner described with respect to FIGS. 5a, 5b and 5c. However, in each of the photomicrographs, there are a great number of asperities and they cannot be seen because they are usually too small to be resolved by an optical microscope. In FIG. 14b, the coating has a closed, non-porous microstructure which characterizes the absence of geometrical shadowing. In contrast, the coating in FIGS. 14e and 14f has an open, porous microstructure including columnar growth formations separated by multiple leaders or open boundaries extending from the surface of the substrate to the surface of the coating. Such a microstructure is a characteristic of substantial geometric shadowing. In FIG. 14d, the coating microstructure is still strongly influenced by geometrical shadowing. Columnar growth defects still occur, but are not as apparent. In FIG. 14c, the coating is still somewhat affected by geometrical shadowing, as evidenced by striations at an angle to the substrate surface, but otherwise has a relatively closed microstructure.

The average rate of deposition is typically in the range of 0.0025 to 0.25 cm. thickness per hour measured parallel to the adatom flux. However, three mechanisms cooperate to deposit material non-uniformly onto the substrate so that the poorer quality deposits remain thinner than the better quality deposits. First, the quantity of sputtered atoms reaching a portion of the substrate surface varies in inverse proportion to the distance of that portion of the surfaces from the target. Hence, referring to FIG. 2, flux $F_2$ travels a greater distance than flux $F_1$ and is, thus, more dispersed angularly when it strikes region $R_2$ than is flux $F_1$ when it strikes region $R_1$. Second, a given flux density incident upon a surface produces a coating whose thickness measured perpendicularly to the surface is proportional to the sine of the angle of incidence of the flux to the surface tangent. Thus, $F_1 \sin a_1$ would be greater than $F_2 \sin a_2$ even if the magnitudes of fluxes $F_1$ and $F_2$ were equal. Third, to the extent that sputtered atoms leave the target with an approximately cosine or similar spatial distribution, more atoms landing on a particular region of the substrate surface will have emanated nearly perpendicularly from the target than emanated at an acute angle from the target surface. Thus, at the same distance from increment $S_1$, the magnitude of flux $F_1$ exceeds the magnitude of flux $F_2$. As a result, portions of the surface nearer to or substantially parallel to the target will receive a greater accumulation of sputtered atoms than portions of the surface more distant from the target or non-parallel to the target surface.

Accordingly, with a flat or convex source and a substrate of large lateral dimensions, aligned with the source as shown in U.S. Pat. No. 4,006,070, material will be deposited non-uniformly onto the substrate surface in the manner shown in FIG. 13a. When depositing onto three-dimensional substrates whose size is relatively smaller than that of the source, non-uniform deposition is obtained principally as a result of the geometric shape of the substrate. However, nonuniformity of deposition can be further enhanced in the latter case by changing the shape of the source as well. For example, a convex source can be used in lieu of a planar source.

Figure 6A:
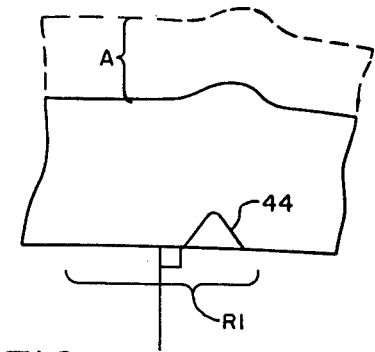
FIGS. 6a, 6b and 6c show the substrate portions of FIGS. 5a, 5b and 5c, respectively, following the step of uniformly removing an amount A of the previously deposited material.
Figure 6B:
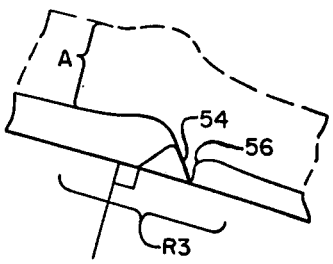
Figure 6C:
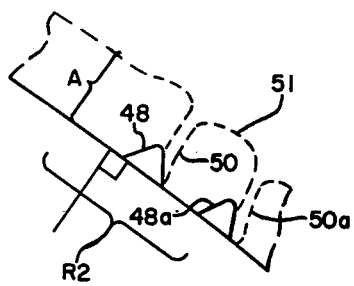

The next step of the process shown in FIGS. 6a to 6c, provides for removal of the deposited material approximately uniformly over the surface of the substrate. In a sputtering apparatus, uniform removal is accomplished by negatively biasing the substrate. The electric field attracts ions from the plasma to the substrate to bombard the surface of the coating. Atoms of the coating are thus ejected from the coating approximately uniformly over the surface of the substrate.

Removal is controlled so that at least a portion of the thickest region of the deposit formed in the first step remains. The proportion of deposited material removed can be varied over a wide range and is determined principally by the intended use of the coated substrate and to a lesser extent by cost considerations.

Figure 7A:
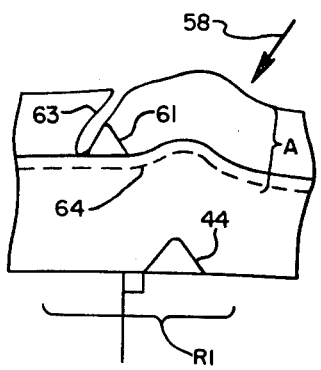
FIGS. 7a, 7b and 7c show the step of deposition of material from a different angle onto the subtrate surface regions of FIGS. 6a, 6b and 6c, respectively.
Figure 7B:
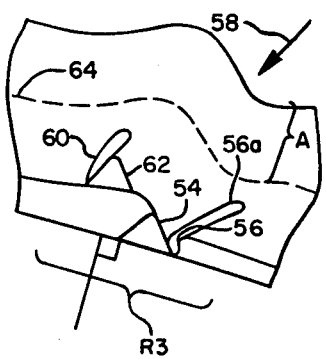
Figure 7C:
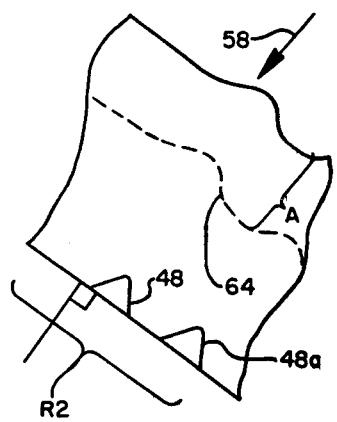

In the next step of the process, the relative position of the source and substrate is altered so that material can be deposited on the substrate from a different angle as shown in FIGS. 7a to 7c. As described above, such relative movement can be accomplished either by moving the substrate, by moving the target or by sputtering from a different target. The amount by which the relative position is changed is determined by the proportion of material removed. The greater the amount removed, the smaller the region of remaining material and, thus, the smaller the incremental changes in relative position between successive deposition and removal steps.

The process is continued by repeating the foregoing steps until the entire surface that is desired to be coated has been coated. The foregoing steps can be performed sequentially and repeated until the substrate is completely coated by laterally overlapping layers of coating material. Alternatively, the foregoing steps can be performed simultaneously so that both deposition and removal occur while continuously changing the relative position of the target and substrate until the substrate is completely coated by one or more contiguous layers of coating material.

In Example 1 below, a superalloy cylindrical pin is coated sequentially with cobalt-chromium-aluminum-yttrium (CoCrAlY). In Example 2, such a pin is coated with the steps being performed simultaneously. In Example 3, a large flat plate is coated with the steps being performed sequentially.

EXAMPLE 1: Sequential Step Method

Referring to FIG. 8a, a superalloy pin 200 is cleaned and positioned in the apparatus of FIGS. 3 and 4 for deposition of a coating from an upper target 124a of CoCrAlY. The apparatus is evacuated and filled with argon gas to 0.003 Torr. (0.4 Pa.). The cathode and plasma power supplies 32, 36 (FIG. 1) are adjusted to 6-8 volts AC and −50 volts DC to ignite a thermionic discharge between the cathode and anode, establishing a plasma in the vacuum chamber. The target voltage $V_t$ is set at zero, and the substrate voltage $V_s$ is adjusted to −100 volts DC to etch the substrate with argon ions for about 10 minutes at a current density of 5 ma./cm. At the end of this period, the voltage $V_t$ on the upper target 124a is adjusted to −100 volts DC. Negatively biasing the target sputters atoms of cobalt, chromium, aluminum and yttrium from the target. A portion of such atoms land on the pin, but are immediately resputtered and, thus, do not accumulate. Voltage $V_t$ is then gradually increased, at 1 to 3 minute intervals, in steps of about 100 volts, to −2000 volts DC.

As the target voltage is being raised, the sputtering rate gradually increases until sufficient material is being emitted for material to begin to accumulate on the substrate despite resputtering. The substrate voltage $V_s$ is then reduced to zero volts to commence high rate deposition. As the target voltage continues to be raised, material is deposited at an accelerating rate. When target voltage $V_2$ is −2000 volts, the rate of deposition is about 0.0025 cm. per hour at 10 ma./cm$^2$. A coating of non-uniform thickness forms along the upper and lateral sides 202, 204, and 205 of the substrate as shown in FIGS. 8b and 14a. Some material is also deposited on the lower side 206 of the pin, out of a line-of-sight of the target, as a result of gaseous backscatter of some of the emitted target atoms.

Following non-uniform deposition, various regions of coating 201 appear much as shown in FIGS. 5a-5c and 14b-14e. The coating is thickest (about 0.0025 cm) along the pin's upper side 202, and becomes progressively thinner progressing toward the pin's lateral sides 204, 205 (about 0.0005 to 0.001 cm.) and thinner yet on its lower side 206 (FIG. 8b) about 0.00001 cm.). In FIG. 14b, the thick coating 201a on first region 202 has a closed, nonporous microstructure as a result of deposition nearly perpendicularly to the substrate surface, as indicated by arrow 226. In contrast, the thin coating 201b in second region 204c (FIG. 14e) has an open, highly porous microstructure. Open leaders or fissures 228 separating columns 230 extend from the substrate surface to the coating surface. The angle of the fissures approximates the angle of the adatom flux, indicated by arrow 232. The surface of the coating in region 204c is highly irregular, as shown in FIG. 14f. In FIG. 14d, the somewhat thicker coating 201c in third region 204b has a striated columnar growth microstructure. The angle of the striations parallels the adatom flux indicated by arrow 234. Fissures or leaders are not as evident in the coating of region 204b as they are in region 204c, but are present nonetheless. In fourth region 204a, shown in FIG. 14c, coating 204d is thicker yet. Its microstructure is even less affected by geometrical shadowing, but still shows a subtle striation parallel to arrow 236, indicating the direction of the net flux in the fourth region.

In the next step, illustrated in FIG. 8c, substrate voltage $V_s$ is adjusted to a voltage above the plasma potential, for example −250 volts DC, and target voltage $V_t$ is reduced to zero. This step causes the plasma ions to bombard the entire surface of the substrate to resputter coating atoms therefrom. An amount of coating material is thus removed uniformly over the substrate. This step continues until sufficient material has been removed to eliminate portions of the coating which are defective. The amount removed is controlled by controlling either the duration of resputtering or the rate of resputtering, which varies with substrate voltage $V_s$ and current $I_s$, or both. Higher yet substrate bias voltages or currents can be used for faster resputtering. However, other considerations, such as avoidance of overheating, impose upper limits on the rate of resputtering.

Figure 14E:
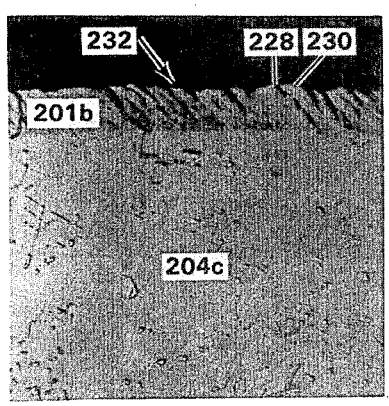
Figure 14F:
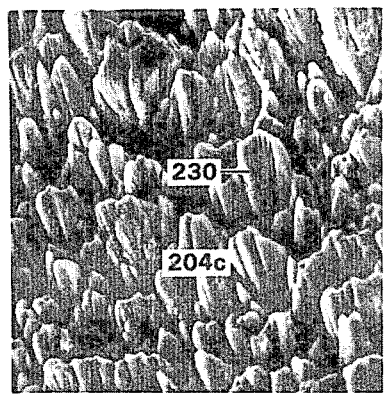
FIG. 14f is a scanning electron microscope photomicrograph taken at 2000× of the surface of the portion of the coating shown in FIG. 14e.

At least the portion of the coating having an open microstructure with obvious columnar growth defects, as shown in FIG. 14e, should be removed. How much more is removed depends on a trade-off between the quality of coating desired and cost considerations. The specific amount to be removed is determined empirically for each different application of the coated substrate.

The effects of the removal step on defects due to geometrical shadowing are illustrated in FIGS. 6a-c. In FIG. 6a, removal of an amount A reduces the thickness of the coating in region R$_1$, but still leaves a coating of substantial thickness. In FIG. 6b, removal of amount A eliminates most but not all of the coating in region R$_3$. Thus, the relative proportions of the non-uniformly deposited coatings of regions R$_1$ and R$_3$ are substantially increased. Leader 56 and related defects in region R$_3$ due to geometric shadowing are nearly eliminated. In FIG. 6c, region R$_2$ has a deposited coating which is thinner than the removal amount A. It is, therefore, entirely eliminated by the uniform removal step, along with leaders 50, 50a, columnar growth structure 51 and any other defects due to geometrical shadowing.

Figure 15A:
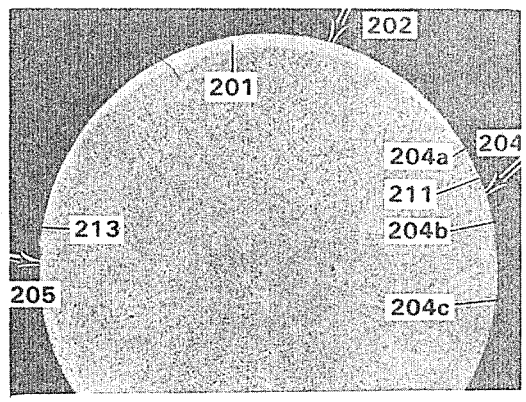
FIGS. 15a–15e are optical photomicrographs of a cross-section of a cylindrical pin following the uniform removal step of the method of the invention, as shown in FIG. 8c, the views corresponding to the views of FIGS. 14a–14e.
Figure 15B:
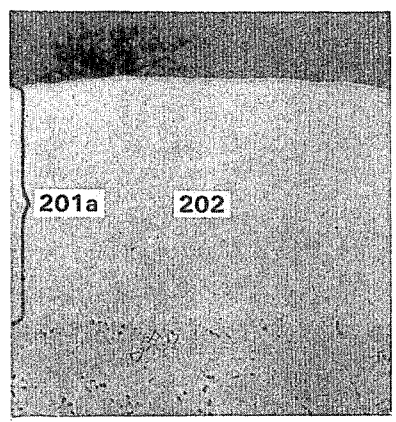
Figure 15C:
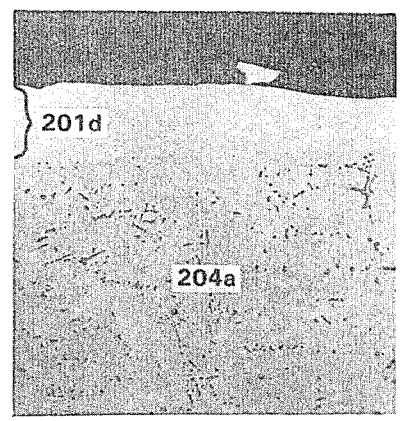
Figure 15D:
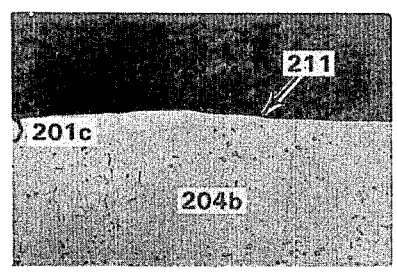
Figure 15E:
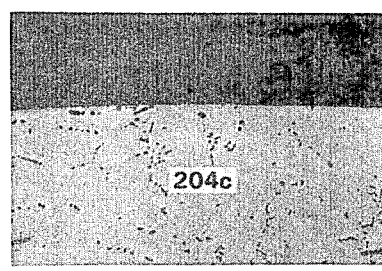

The results of uniform removal are illustrated in greater detail in FIGS. 15a-e. In FIG. 15b, a major portion of the coating 201 in the first region 202 remains. In contrast, the coating is entirely eliminated from the second region 204c, as shown in FIG. 15e. In FIG. 15d, the thinner portions of the coating in third region 204b are removed while the thicker portions are reduced to a thin layer. In FIG. 15c, a somewhat thicker coating layer is left in the fourth region 204a. All of the material showing the most marked columnar growth defects is removed from the second region 204c of FIG. 15e. Similarly, nearly all of the striated coating material of the third region 204b is removed, leaving a coating boundary 211 in FIGS. 15a and 15d. To the right of the boundary, no coating remains; to the left of it, only the margin of coating 201c remains. Even in the region 204a (FIG. 15c) the thickness of coating material is substantially reduced in proportion to the thickness of the coating in the first region 202. Comparing FIGS. 14b and 14c with FIGS. 15b and 15c, respectively, the ratios 201a to 201d of the coating thicknesses in such regions are reduced from about ½ to about ⅓.

Following the uniform removal step, a ridge portion 210 on top of the pin is all that remains of the coating 201 as shown in FIG. 8c. The pin is then rotated through an angle 214 such that the substrate surface at the boundary 213 of ridge portion 210 is approximately parallel to the target 124a (perpendicular to the net flux), as shown in FIG. 8d. Then, target and substrate voltages $V_t$, $V_s$ are progressively adjusted to $-2000$ volts and zero, respectively, in the manner described above. Coating material is thus deposited in the same manner as the first coating in FIG. 8b, but from a different angle to form a second coating 215 offset angularly from coating ridge 210.

The effects on coating quality due to rotating and depositing a second time from a different angle are illustrated in FIGS. 7a–c. The new angle of incidence of the net flux, indicated by arrows 58, shifts the tendency toward formation of geometrical shadows away from region $R_3$ and toward region $R_1$. An asperity 61 on the surface of the first deposit will create a shadow causing a new leader 63 to form. Consequently, a poor quality deposit comparable to that of FIGS. 5c and 14e is added to region $R_1$ in FIG. 7a. However, the remainder of the underlying first deposit is of relatively high quality and is thick enough to survive subsequent removal steps. A medium quality deposit is added to region $R_3$ in FIG. 7b over the remainder of the first deposit on such region. However, the remnant of leader 56 provides a shadowing site for a new leader 56a. This leader and other new leaders, such as leader 60 due to a new asperity 62, do not extend to the substrate surface. In region $R_2$ of FIG. 7c a high quality deposit is formed like that of FIG. 5a. No shadow, and thus no leader, forms around asperities 48, 48a.

In FIG. 8e, the uniform removal step of FIG. 8c is repeated. An amount A is again removed, as indicated by dashed lines 64 in FIGS. 7a–c. Following removal of such amount, a second ridge of coating 216, overlapping a portion of ridge 210, is all that remains.

The steps of depositing, removing and rotating are then repeated until the entire pin is coated, as shown in FIGS. 8f and 16. If a thicker coating is desired, the process can be continued through additional revolutions of the pin.

If a coating of somewhat lesser quality suffices for the intended purpose of the pin, removal can be limited to coating ridge 212, as shown in FIG. 8c. Referring to FIG. 9, the larger width of ridge 212 allows the substrate to be rotated through an angle 218 which is somewhat larger than angle 214 (FIG. 8d) before depositing a second time. This allows the pin to be entirely coated in a fewer number of repetitions than required for the coating of FIG. 8f.

Similarly, use of a second target 124b in FIG. 10a, on the opposite side of the substrate form target 124a, allows the substrate to be coated in half as many repetitions as with one target. FIG. 10a shows a pin following the first deposition and removal. At this stage, the pin has coating ridges 220, 222 which correspond to ridge 212 in FIG. 8c. After rotating the pin once through angle 224, and depositing and removing a second time, the entire pin is coated, as shown in FIG. 10b.

When deposited simultaneously from two targets, it is necessary to carefully control the amounts deposited by each target for two reasons. First, the amounts deposited by each target should be relatively equal so as to obtain a substantially uniform thickness coating in the final product. Second, the amounts deposited must be controlled to prevent too much material from accumulating along the lateral sides 204, 205. The amounts jointly deposited on such sides by both targets must not exceed the amount to be removed. Otherwise, not all of the poorest quality deposits will be removed. Just as the amount to be removed is empirically determined, so is the maximum amount that can be deposited by two targets. In any event, the amount jointly deposited by both targets on the lateral sides must not exceed the amounts deposited on the upper and lower sides 202, 206. This requires a greater degree of non-uniformity of deposition than when one target is used. Consequently, it is preferable to use two planar targets only for coating substrates whose diameter is about the width of the target, or larger. For depositing from two targets onto smaller-sized substrates, non-uniformity of deposition can be increased by changing the target geometry, for example, to a convex shape.

In a further variation of this method, it is possible to deposit alternatingly from the two targets. First, material is nonuniformly deposited from target 138a, followed by uniform removal. Then, material is deposited from target 138b, followed by uniform removal. This method avoids the above-described problem that can arise when simultaneously depositing from two targets.

The targets also need not be positioned on opposite sides of the substrate. The second target can be positioned alongside the first target so as to deposit onto the substrate from a different orientation as indicated by arrows 58 in FIGS. 7a, 7b and 7c. By providing multiple targets, it is thus possible to alternatingly deposit from each target to produce all possible desired substrate-to-target orientations without physically moving the substrate or target.

EXAMPLE 2: Simultaneous Step Method

The simultaneous step method of FIGS. 11a to 11e is performed in substantially the same way as the above-described sequential step method. However, deposition, removal and rotation occur simultaneously.

Rotation of the pin commences during etching. Rather than rotating in steps, the pin is rotated continuously. Following etching, voltage $V_s$ is maintained at $-100$ volts DC and target voltage $V_t$ is progressively increased to between $-2000$ and $-2400$ volts DC. However, when the deposition rate begins to exceed the resputtering rate, the substrate voltage $V_s$ is not reduced to zero. Instead voltage $V_s$ is set within a range of about $-35$ to $-100$ volts DC to establish a constant resputtering rate R corresponding to the amount of material needed to be removed to obtain a selected coating quality. Typically voltage $V_s = -50$ volts.

All material initially deposited on the pin is resputtered until the deposition rate D on upper side 202 exceeds the resputtering rate R. The deposition rate D continues to increase as voltage $V_t$ increases. The resputtering rate R remains constant. When voltage $V_t$ increases to, for example, $-2000$ volts, a net deposition rate $D_N=D-R$ is established. Material is then continuously deposited at such rate on the pin along upper side 202 facing the target while the pin rotates clockwise as indicated by arrows 250, 252, 254 and 256 in FIGS. 11a–11d, respectively.

Resputtering prevents material from being added along the lower side 206 and lateral sides 204, 205. Coating material is thus deposited only on the side of the pin facing the target. Were the pin not rotating, the profile of the coating would look like that shown in FIGS. 8c and 15a–e. However, rotation of the pin causes the first-deposited coating portion 258 to gradually rotate out of a line-of-sight with the target, as shown in FIGS. 11a–c. Coating material ceases to be deposited on portion 258 but resputtering continues to remove material at rate R. Thus, as the pin rotates, the coating portion 258 is gradually reduced in thickness. If the resputtering rate R is too high, the coating material of portion 258 will be entirely removed before the portion rotates back into a line-of-sight with the target.

Accordingly, the net deposition rate $D_N$ must exceed the resputtering rate R. When one target is used for deposition, this limitation requires that the deposition rate exceed twice the resputtering rate, that is, $D>2R$. In other words, the average re-emission rate must be less than 50% in order to coat a substrate with one target using the simultaneous step method. Economical coating requires even lower re-emission rates yet, probably having a maximum in the 30–40% range. At the same time the re-emission rate must be high enough to inhibit the development of coatings having columnar growth defects along lateral sides 204, 205.

Resputtering while portion 258 is out of a line-of-sight with the target 124a eliminates any poor quality material deposited at an acute angle along lateral side 204. As the pin rotates, material is deposited at sides 204 on top of higher quality material previously deposited nearly perpendicularly to the substrate surface along upper side 202. The higher quality material is later re-exposed when the poorer quality deposited along side 204 is resputtered. This phenomenon is illustrated by the angle 264 between leading edge or boundary 260 of portion 258 and a rotational reference indicator 262 at a fixed portion on the substrate. Proceeding from FIG. 11a through FIG. 11c, the leading edge progressively recedes because of resputtering so that angle 264 becomes smaller. By the time the pin has made a full revolution, as indicated in FIG. 11d by arrow 256, what remains of portion 258 is covered by new coating material as that portion returns to a line-of-sight with the target. Consequently, leading edge 260 ceases receding.

However, referring again to FIG. 11a, coating portion 266 deposited between upper side 202 and lateral side 205 is not removed before being covered. If too much material is deposited on portion 266 at an acute angle, defects due to geometrical shadowing including columnar growth defects can form which are not removed by resputtering. Such defects result in weaknesses in the coating that are not adequately remedied by subsequently covering them with higher quality coating material. The defects tend to be replicated in the higher quality material so that they still appear at the surface. Therefore, the resputtering rate R must be high enough to inhibit the accumulation of deposits of material incident at a very acute angle.

In general, for a given rate of deposition D the resputtering rate R is determined empirically. It depends on the ultimate quality of the coating that is desired. If the coating has too open or striated a microstructure for a particular application, the resputtering rate is increased by increasing the negative substrate bias. If a more open microstructure will suffice, the resputtering rate can be reduced. This allows the coating to be deposited more quickly, that is, in fewer revolutions. It has been found that very high quality CoCrAlY coatings are obtained on superalloy pins and superalloy turbine components when substrate voltage $V_s=-50$ volts and target voltage $V_t=-2000$ volts. It is believed that these parameters produce a re-emission rate in the range of 10–20%. For yet higher quality coatings, such as optical or semiconductor coatings, a higher re-emission rate, for example 25–30%, could be used.

It should be obvious that the use of multiple targets, as described in Example 1, can be extended to this example. Removal by resputtering is carried out simultaneously with deposition, but deposition is performed alternatingly by the different targets, for example, one at a time.

EXAMPLE 3: Coating Large Surfaces

Large surfaces can be coated by either the sequential or simultaneous step methods of the invention. As mentioned above, an apparatus similar to that disclosed in U.S. Pat. No. 4,006,070 can be used, by modifying it to permit negatively biasing the substrate. For purposes of this example, only the sequential step method is shown.

Referring to FIGS. 13a–d, a large planar substrate 300 is positioned below multiple planar targets 302, 304, 306. Operation of the sputtering apparatus is initiated in a manner similar to that described in the previous examples.

In the first step, shown in FIG. 13a, material is deposited from each target onto the surface of the substrate to form first coatings 308, 310 of non-uniform thickness centered at lateral positions $P_1$ and $P_2$, respectively. The central portion 312 of each coating forms directly beneath each target. It is relatively thick and of high quality because of the nearly perpendicular angle of incidence of flux 314 forming such central portions and its proximity to the nearest target. Below the space between the targets, the tail portions 316 of each coating become progressively thinner and poorer in quality than the central regions as the angle of incidence of the flux 318 forming such tail portions decreases (becomes increasingly acute), causing geometrical shadowing. The magnitude of flux 318 incident on the tail portions also decreases as the angle of incidence decreases and the distance from the targets increases.

Next, deposition ceases and coating material is resputtered uniformly from the substrate surface. Following resputtering, the coating appears much as shown in FIG. 13b. Central portions 312 are reduced in thickness while tail regions 316 are eliminated. Thus, the poorer quality deposits—those containing defects due to geometrical shadowing—are eliminated or at least reduced to an acceptable minimum for a particular application.

Following the removal step, the targets 302, 304 and 306 are moved laterally relative to the substrate to a position $Q_1$ between positions $P_1$ and $P_2$. Material is again deposited on the substrate surface to form second coatings 318, 320 and 322, as shown in FIG. 13c. The second coatings have their thickest, highest quality central regions 324 immediately below the targets and covering the regions of the substrate uncovered by the prior removal of tail portions 316. The second coatings have tail portions 326 overlying previously deposited central portions 312.

Tail portions 326 can be removed, as shown in FIG. 13d by repeating the uniform removal step. Removal of tail portions 326 re-exposes central portions 312 and reduces the thickness of central portion 324. The resultant coating covers the entire substrate surface to a nearly uniform depth and has a high quality microstructure.

The quality of the resultant coating can be improved by removing more material during each removal step and by shifting the targets laterally by smaller increments preparatory to subsequent deposition steps.

Simultaneous deposition, removal and lateral translation or oscillation of the targets can be used to eliminate or reduce the discrete junctions between each coating, if desired.

CHARACTERISTICS OF RESULTANT COATED SUBSTRATES

As discussed above, physical vapor deposited coatings have a number of highly desirable and useful characteristics. These native, as-deposited characteristics include a high degree of both structural and compositional homogeneity, fine grain size, and very high coating-to-substrate adherence. Such desirable coating characteristics result primarily from the fact that physical vapor deposition involves despositing directly from a vapor state to a solid state to form coatings having a non-equilibrium composition or structure.

Previous methods of deposition produced coatings suffering from columnar growth boundaries and boundary defects resulting from geometrical shadowing. Such defects yield an open, porous or striated microstructure, as shown in FIGS. 14c-14e. Such defects are, likewise, a non-equilibrium characteristic, albeit an undesirable one. Prior methods of reducing defects due to geometric shadowing, such as heat treatment or rotating while depositing or both, fail to eliminate such defects, as shown in FIG. 18. They also impair the desireable as-deposited characteristics of the coatings.

FIGS. 16, 16a, 16b, 17a and 17b show sputtered CoCrAlY coating 350, 360 deposited in accordance with the invention. As originally deposited at about 700° C., coatings 350 and 360 both have a closed non-porous microstructure everywhere on the surface of the pin.

Referring to FIGS. 17a and 17b coating 360, has a closed non-porous microstructure in all regions of the three-dimensional substrate surface without having been heat treated. The microstructure is free of columnar growth defects due to geometrical shadowing in all regions of the surface of the blade. Grain size averages less than 1 micron in diameter and 5 microns in length (Bracket size 362 is approximately 5 microns). The microstructure is homogeneous down to an average two-phase grain size of about 1 micron diameter. The coating-to-substrate adherence is the native adherence inherent in as-deposited coatings. It is free of fracturing or boundary diffusion resulting from thermal or mechanical treatment. For sputtered coatings, this adherence is ordinarily great enough that if any separation were to occur between the coating and the substrate, it would not occur at their interface 364; it would occur within the weaker of the body of the substrate or of the coating.

Referring to FIGS. 16a and 16b, coating 350 was also deposited in accordance with the invention. However, heat treating the pin at 1050° C. increases grain size and the average length of two phase grain structures, which indicates degree of homogeneity, to 10 microns in diameter or more, as indicated generally by the 25-micron bracket 352. Coating-to-substrate adherence is also likely to be somewhat reduced as a result of fractures or boundary diffusion at the interface 354 due to heat treatment.

A coating deposited in accordance with prior methods is contrasted with a coating deposited in accordance with the invention in FIGS. 18 and 19, respectively. The pin of FIG. 18 was etched prior to sputtering to provide the CoCrAlY coating 370 with the cleanest possible surface 372. The pin was then rotated during deposition. This technique diminished the voids or leaders 374 and associated columnar growth structures and caused them to grow perpendicularly to the substrate surface, but did not eliminate them. An overlayer coating 376 of platinum was also sputter-deposited over the CoCrAlY coating. Then the pin was heat treated at 1050° C. Heat treating caused the platinum coating to diffuse laterally sufficiently to close the surface of the coating, but did not close the leaders in the CoCrAlY layer. Once the platinum overlayer wears away during use, the coating 370 will cease to protect surface 372 from corrosive agents which can traverse the coating through the remaining leaders. In contrast, the somewhat thinner heat treated CoCrAlY coating 380 shown in FIG. 19, deposited in accordance with the invention, is entirely free of leaders. Even without a platinum overlayer, coating 380 will provide the pin's surface much longer lasting protection than coating 370.

It can also be seen, that cleaning the substrate surface prior to deposition is not responsible for the elimination of columnar growth defects. FIGS. 20 and 21 show the same section of a CoCrAlY coating 390 applied to the surface 392 of a turbine blade. In FIG. 20, the section is shown as polished; in FIG. 21 the section has been chemically etched to enhance its microstructure. The turbine blade surface 392 was neither cleaned nor etched prior to deposition. Hence, many asperities remained on the surface which would encourage columnar growth if the coating were deposited in accordance with prior techniques. However, it is readily apparent that coating 390 is free of columnar growth defect. Deposition in accordance with the invention prevented growth of such defects despite the dirty surface.

Referring to FIG. 22, even higher quality coatings than those shown in FIGS. 16a, 16b, 17a and 17b are possible. FIG. 22 shows a section of a cylindrical pin coated at about 500° C. in accordance with the invention and etched to enhance the CoCrAlY microstructure. The coating 400 is free of any columnar growth defects, striations or microstructural coarseness due to geometrical shadowing. Moreover, the average grain size is extremely small—about 0.1 micron—due to the lower deposition temperature. Coatings of this quality are useful, not only in metallurgical applications, but in optical and semiconductor applications as well. Grain size can be further reduced without producing geometrical growth defects by reducing deposition temperature, adding diffusion inhibitors, and other techniques known in the art for reducing grain size.

Although the examples shown and described herein deal with metallic coatings applied to metal substrates, the invention is not so limited. It is applicable to all fields in which line-of-sight deposition is used, and is particularly applicable to physical vapor deposition techniques, of which sputtering is just one example. Moreover, it is applicable to all the various combinations of materials that can be used as substrate and coating materials. The invention is thus useful in any application of line-of-sight deposition in which it would be desirable to limit or eliminate defects due to geometrical shadowing without sacrificing the native qualities of the deposited coatings. It is also useful even where heat treatment might subsequently be used. For example, it may be more important to relieve internal coating or substrate stresses than preserve the coating characteristics just as they were deposited. The invention simply renders post-deposition heat treatment or high temperature deposition unnecessary as a means for eliminating deposition defects due to geometrical shadowing. Such defects are eliminated during the deposition process itself.

Having shown and described our invention and several embodiments and examples thereof, it should be apparent to those skilled in the art that modifications can be made without departing from the spirit of the invention. Accordingly, we claim all modifications falling within the scope of the following claims.

We claim:

1. A coated substrate comprising:
a substrate having a three-dimensional surface and a physical vapor deposited solid coating covering said surface;
said surface including at least first and second surface portions mutually oriented so that parallel lines of sight intersect the first portion at about a right angle and the second portion at an acute angle sufficient to produce geometric shadowing thereon;
said coating having a substantially uniform microstructure over said surface with any columnar growth defects therein due to geometric shadowing being limited in length to less than the thickness of the coating;
said coating being substantially free of microstructural modifications caused by heat treatment.

2. A coated substrate according to claim 1 in which the coating is free of columnar growth defects.

3. A coated substrate according to claim 1 is a concavo-convex surface, the coating having a microstructural through-porosity of less than the thickness of the coating over the entirety of the surface.

4. A coated substrate according to claim 1 in which the coating is free of through-porosity.

5. A coated substrate according to claim 1 in which the coating is structurally homogeneous down to a diameter of approximately one micron.

6. A coated substrate according to claim 1 in which the coating is characterized by a non-equilibrium microstructure.

7. A coated substrate comprising:
a substrate having a three-dimensional external surface including a first surface portion in a first plane and a second surface in a second plane oriented at an angle of at least about 60° from the first plane; and
a physical vapor deposited solid coating covering said surface including said first and second portions;
substantially the entire coating having a microstructure in which any voids therein due to geometric shadowing are limited in length to less than the thickness of the coating;
said coating having a substantially uniform microstructure over said surface and being structurally homogeneous down to a dimension of approximately one micron.

8. A coated substrate according to claim 7 in which the coating has a substantially uniform thickness.

9. A coated substrate according to claim 7 in which the coating has a grain size of less than one micron diameter.

10. A coated substrate according to claim 7 having a coating-to-substrate adherence such that any separation of the coating from the substrate will occur within one of the substrate and the coating, but not at their interface.

11. A coated substrate according to claim 7 in which the coating is sputter-deposited.

12. A coated substrate according to claim 7 in which:
the coating has a microstructure of approximately uniform density over the entirety of the surface; and
and voids in said microstructure are limited so that said coating is substantially impervious to liquids.

13. A coated substrate comprising:
a substrate having a three-dimensional surface extending entirely around at least a portion of the substrate; and
a sputter-deposited coating entirely covering said surface;
said coating being free of columnar growth defects due to geometrical shadowing.

14. A coated substrate according to claim 13 in which a first portion of coating material has been deposited free of any of said defects on a region of said surface following the resputtering from said region of a second portion containing said defects.

15. A coated substrate according to claim 13 in which the coating is substantially free of microstructural modifications caused by heat treatment.

16. A coated substrate comprising a substrate having a coating which includes:
a first physical vapor deposited coating initially deposited nonuniformly over first and second surface portions of a substrate, more thickly on the first portion than on the second portion, and then removed in part approximately uniformly from both portions so as to leave a residual coating substantially free of columnar growth defects covering only the first surface portion; and
a second physical vapor deposited coating initially deposited on the substrate, in a nonuniform thickness offset from the first surface portion so as to overlap the residual coating and more thickly cover the second surface portion, and then removed in part approximately uniformly so as to expose a portion of the residual coating.

17. A coated substrate comprising a substrate having a coating which includes:
a first physical vapor deposited coating initially deposited over first and second surface portions of a substrate, at a high angle of incidence on the first portion and a low angle of incidence on the second portion, and partially removed so as to leave a first residual coating covering only the first surface portion; and
a second physical vapor deposited coating deposited and partially removed in essentially the same manner as the first coating but offset therefrom along the substrate surface to provide a second residual coating covering the second surface portion and overlapping the first residual coating.

* * * * *

UNITED STATES PATENT AND TRADEMARK OFFICE
CERTIFICATE OF CORRECTION

PATENT NO. :   4,468,437
DATED      :   August 28, 1984
INVENTOR(S) : JAMES W. PATTEN; RONALD W. MOSS and
              EDWIN D. MCCLANAHAN It is certified that error appears in the above-identified patent and that said Letters Patent is hereby corrected as shown below:

On the cover page under "Related U.S. Application Data," "Continuation" should be --Division--.

Column 19, line 56, after "than" insert --about--.

Signed and Sealed this

Nineteenth Day of March 1985

[SEAL]

Attest:

DONALD J. QUIGG

Attesting Officer     Acting Commissioner of Patents and Trademarks